United States Patent
Fagg

(10) Patent No.: US 7,974,580 B2
(45) Date of Patent: Jul. 5, 2011

(54) APPARATUS AND METHOD FOR MODULATING AN AMPLITUDE, PHASE OR BOTH OF A PERIODIC SIGNAL ON A PER CYCLE BASIS

(75) Inventor: Russell John Fagg, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 964 days.

(21) Appl. No.: 11/846,401

(22) Filed: Aug. 28, 2007

(65) Prior Publication Data
US 2009/0061777 A1    Mar. 5, 2009

(51) Int. Cl.
*H04B 7/00*    (2006.01)
*H04B 1/04*    (2006.01)

(52) U.S. Cl. ............... 455/42; 455/108; 455/126
(58) Field of Classification Search ............ 455/42, 455/108, 110, 126, 130, 205, 115.1
See application file for complete search history.

(56) References Cited

U.S. PATENT DOCUMENTS

| | | | |
|---|---|---|---|
| 5,410,280 A * | 4/1995 | Linguet et al. ............ 332/149 |
| 5,687,169 A | 11/1997 | Fullerton |
| 5,764,696 A | 6/1998 | Barnes et al. |
| 5,812,081 A | 9/1998 | Fullerton |
| 5,832,035 A | 11/1998 | Fullerton |
| 5,907,427 A | 5/1999 | Scalora et al. |
| 5,952,956 A | 9/1999 | Fullerton |
| 5,960,031 A | 9/1999 | Fullerton et al. |
| 5,963,581 A | 10/1999 | Fullerton et al. |
| 5,969,663 A | 10/1999 | Fullerton et al. |
| 5,995,534 A | 11/1999 | Fullerton et al. |
| 6,031,862 A | 2/2000 | Fullerton et al. |
| 6,091,374 A | 7/2000 | Barnes |
| 6,111,536 A | 8/2000 | Richards et al. |
| 6,133,876 A | 10/2000 | Fullerton et al. |
| 6,177,903 B1 | 1/2001 | Fullerton et al. |
| 6,188,880 B1 * | 2/2001 | Sanielevici ............ 455/296 |
| 6,218,979 B1 | 4/2001 | Barnes et al. |
| 6,295,019 B1 | 9/2001 | Richards et al. |
| 6,297,773 B1 | 10/2001 | Fullerton et al. |

(Continued)

FOREIGN PATENT DOCUMENTS
EP    1526693    4/2005

OTHER PUBLICATIONS

International Search Report and Written Opinion—PCT/US2008/074575, International Search Authority—European Patent Office—Dec. 3, 2009.

(Continued)

*Primary Examiner* — Sonny Trinh
(74) *Attorney, Agent, or Firm* — Dang M. Vo

(57) ABSTRACT

An apparatus for wireless communications is disclosed including a signal generator adapted to generate a substantially periodic signal including a plurality of cycles, and a modulator adapted to modulate an amplitude, a phase or both the amplitude and the phase of the periodic signal on a per cycle basis. In one aspect, the modulator is adapted to modulate the amplitude, the phase, or both the amplitude and phase of the periodic signal with a defined modulation signal. In another aspect, the defined modulation signal includes a substantially root raised cosine signal. In yet another aspect, the defined modulation signal is configured to achieve a defined frequency spectrum for the modulated periodic signal.

75 Claims, 7 Drawing Sheets

U.S. PATENT DOCUMENTS

| | | | |
|---|---|---|---|
| 6,300,903 | B1 | 10/2001 | Richards et al. |
| 6,304,623 | B1 | 10/2001 | Richards et al. |
| 6,351,652 | B1 | 2/2002 | Finn et al. |
| 6,354,946 | B1 | 3/2002 | Finn |
| 6,400,307 | B2 | 6/2002 | Fullerton et al. |
| 6,400,329 | B1 | 6/2002 | Barnes |
| 6,421,389 | B1 | 7/2002 | Jett et al. |
| 6,430,208 | B1 | 8/2002 | Fullerton et al. |
| 6,437,756 | B1 | 8/2002 | Schantz |
| 6,462,701 | B1 | 10/2002 | Finn |
| 6,466,125 | B1 | 10/2002 | Richards et al. |
| 6,469,628 | B1 | 10/2002 | Richards et al. |
| 6,470,057 | B1 * | 10/2002 | Hui et al. ............... 375/294 |
| 6,483,461 | B1 | 11/2002 | Matheney et al. |
| 6,489,893 | B1 | 12/2002 | Richards et al. |
| 6,492,904 | B2 | 12/2002 | Richards |
| 6,492,906 | B1 | 12/2002 | Richards et al. |
| 6,501,393 | B1 | 12/2002 | Richards et al. |
| 6,504,483 | B1 | 1/2003 | Richards et al. |
| 6,512,455 | B2 | 1/2003 | Finn et al. |
| 6,512,488 | B2 | 1/2003 | Schantz |
| 6,519,464 | B1 | 2/2003 | Santhoff et al. |
| 6,529,568 | B1 | 3/2003 | Richards et al. |
| 6,538,615 | B1 | 3/2003 | Schantz |
| 6,539,213 | B1 | 3/2003 | Richards et al. |
| 6,549,567 | B1 | 4/2003 | Fullerton |
| 6,552,677 | B2 | 4/2003 | Barnes et al. |
| 6,556,621 | B1 | 4/2003 | Richards et al. |
| 6,560,463 | B1 | 5/2003 | Santhoff |
| 6,571,089 | B1 | 5/2003 | Richards et al. |
| 6,573,857 | B2 | 6/2003 | Fullerton et al. |
| 6,577,691 | B2 | 6/2003 | Richards et al. |
| 6,585,597 | B2 | 7/2003 | Finn |
| 6,593,886 | B2 | 7/2003 | Schantz |
| 6,606,051 | B1 | 8/2003 | Fullerton et al. |
| 6,611,234 | B2 | 8/2003 | Fullerton et al. |
| 6,614,384 | B2 | 9/2003 | Hall et al. |
| 6,621,462 | B2 | 9/2003 | Barnes |
| 6,636,566 | B1 | 10/2003 | Roberts et al. |
| 6,636,567 | B1 | 10/2003 | Roberts et al. |
| 6,636,573 | B2 | 10/2003 | Richards et al. |
| 6,642,903 | B2 | 11/2003 | Schantz |
| 6,661,342 | B2 | 12/2003 | Hall et al. |
| 6,667,724 | B2 | 12/2003 | Barnes et al. |
| 6,670,909 | B2 | 12/2003 | Kim |
| 6,671,310 | B1 | 12/2003 | Richards et al. |
| 6,674,396 | B2 | 1/2004 | Richards et al. |
| 6,677,796 | B2 | 1/2004 | Brethour et al. |
| 6,700,538 | B1 | 3/2004 | Richards |
| 6,710,736 | B2 | 3/2004 | Fullerton et al. |
| 6,717,992 | B2 | 4/2004 | Cowie et al. |
| 6,748,040 | B1 | 6/2004 | Johnson et al. |
| 6,750,757 | B1 | 6/2004 | Gabig, Jr. et al. |
| 6,759,948 | B2 | 7/2004 | Grisham et al. |
| 6,760,387 | B2 | 7/2004 | Langford et al. |
| 6,762,712 | B2 | 7/2004 | Kim |
| 6,763,057 | B1 | 7/2004 | Fullerton et al. |
| 6,763,282 | B2 | 7/2004 | Glenn et al. |
| 6,774,846 | B2 | 8/2004 | Fullerton et al. |
| 6,774,859 | B2 | 8/2004 | Schantz et al. |
| 6,778,603 | B1 | 8/2004 | Fullerton et al. |
| 6,781,530 | B2 | 8/2004 | Moore |
| 6,782,048 | B2 | 8/2004 | Santhoff |
| 6,788,730 | B1 | 9/2004 | Richards et al. |
| 6,822,604 | B2 | 11/2004 | Hall et al. |
| 6,823,022 | B1 | 11/2004 | Fullerton et al. |
| 6,836,223 | B2 | 12/2004 | Moore |
| 6,836,226 | B2 | 12/2004 | Moore |
| 6,845,253 | B1 | 1/2005 | Schantz |
| 6,847,675 | B2 | 1/2005 | Fullerton et al. |
| 6,879,878 | B2 | 4/2005 | Glenn et al. |
| 6,882,301 | B2 | 4/2005 | Fullerton |
| 6,895,034 | B2 | 5/2005 | Nunally et al. |
| 6,900,732 | B2 | 5/2005 | Richards |
| 6,906,625 | B1 | 6/2005 | Taylor et al. |
| 6,907,244 | B2 | 6/2005 | Santhoff et al. |
| 6,912,240 | B2 | 6/2005 | Kumar et al. |
| 6,914,949 | B2 | 7/2005 | Richards et al. |
| 6,917,284 | B2 | 7/2005 | Grisham et al. |
| 6,919,838 | B2 | 7/2005 | Santhoff |
| 6,922,166 | B2 | 7/2005 | Richards et al. |
| 6,922,177 | B2 | 7/2005 | Barnes et al. |
| 6,925,109 | B2 | 8/2005 | Richards et al. |
| 6,933,882 | B2 | 8/2005 | Fullerton |
| 6,937,639 | B2 | 8/2005 | Pendergrass et al. |
| 6,937,663 | B2 | 8/2005 | Jett et al. |
| 6,937,667 | B1 | 8/2005 | Fullerton et al. |
| 6,937,674 | B2 | 8/2005 | Santhoff et al. |
| 6,947,492 | B2 | 9/2005 | Santhoff et al. |
| 6,950,485 | B2 | 9/2005 | Richards et al. |
| 6,954,480 | B2 | 10/2005 | Richards et al. |
| 6,959,031 | B2 | 10/2005 | Haynes et al. |
| 6,959,032 | B1 | 10/2005 | Richards et al. |
| 6,963,727 | B2 | 11/2005 | Shreve |
| 6,980,613 | B2 | 12/2005 | Krivokapic |
| 6,989,751 | B2 | 1/2006 | Richards |
| 7,015,793 | B2 | 3/2006 | Gabig, Jr. et al. |
| 7,020,224 | B2 | 3/2006 | Krivokapic |
| 7,027,425 | B1 | 4/2006 | Fullerton et al. |
| 7,027,483 | B2 | 4/2006 | Santhoff et al. |
| 7,027,493 | B2 | 4/2006 | Richards |
| 7,030,806 | B2 | 4/2006 | Fullerton |
| 7,042,417 | B2 | 5/2006 | Santhoff et al. |
| 7,046,187 | B2 | 5/2006 | Fullerton et al. |
| 7,046,618 | B2 | 5/2006 | Santhoff et al. |
| 7,069,111 | B2 | 6/2006 | Glenn et al. |
| 7,075,476 | B2 | 7/2006 | Kim |
| 7,079,827 | B2 | 7/2006 | Richards et al. |
| 7,099,367 | B2 | 8/2006 | Richards et al. |
| 7,099,368 | B2 | 8/2006 | Santhoff et al. |
| 7,129,886 | B2 | 10/2006 | Hall et al. |
| 7,132,975 | B2 | 11/2006 | Fullerton et al. |
| 7,145,954 | B1 | 12/2006 | Pendergrass et al. |
| 7,148,791 | B2 | 12/2006 | Grisham et al. |
| 7,151,490 | B2 | 12/2006 | Richards |
| 7,167,525 | B2 | 1/2007 | Santhoff et al. |
| 7,170,408 | B2 | 1/2007 | Taylor et al. |
| 7,184,938 | B1 | 2/2007 | Lansford et al. |
| 7,190,722 | B2 | 3/2007 | Lakkis et al. |
| 7,190,729 | B2 | 3/2007 | Siwiak |
| 7,206,334 | B2 | 4/2007 | Siwiak |
| 7,209,724 | B2 | 4/2007 | Richards et al. |
| 7,230,980 | B2 | 6/2007 | Langford et al. |
| 7,239,277 | B2 | 7/2007 | Fullerton et al. |
| RE39,759 | E | 8/2007 | Fullerton |
| 7,256,727 | B2 | 8/2007 | Fullerton et al. |
| 7,271,779 | B2 | 9/2007 | Hertel |
| 7,280,601 | B2 | 10/2007 | Roberts |
| 7,391,802 | B2 | 6/2008 | Orlik et al. |

OTHER PUBLICATIONS

Norimatsu T et al: IIa UW8-IR Transmitter With Digitally Controlled Pulse GeneratorIIIEEE Journal of Solid-State Circuits, IEEE Service Center, Piscataway, NJ, US LNKD—DOI:10.1109/JSSC.2007.897137, vol. 42, No. 6, Jun. 1, 2007, pp. 1300-1309, XP0111848881SSN: 0018-9200.

* cited by examiner

APPARATUS AND METHOD FOR MODULATING AN AMPLITUDE, PHASE OR BOTH OF A PERIODIC SIGNAL ON A PER CYCLE BASIS

BACKGROUND

1. Field

The present disclosure relates generally to communications systems, and more specifically, to an apparatus and method of modulating an amplitude, phase, or both the amplitude and phase of a substantially periodic signal on a per cycle basis.

2. Background

Communications devices that operate on limited power supplies, such as a battery, typically use techniques to provide the intended functionality while consuming relatively small amounts of power. One technique that has been gaining in popularity relates to transmitting signals using pulse modulation techniques. This technique generally involves transmitting information using low duty cycle pulses and operating in a low power mode during times when not transmitting the pulses. Thus, in these devices, the efficiency is typically better than communications devices that operate a transmitter continuous.

Usually, these low power communications devices have strict transmission specification requirements dictated typically by governmental agencies. In order to ensure that governmental requirements are met as well as to more precisely transmit and receive signals among communications devices, the frequency components or spectrum of the pulses transmitted should be accurately controlled. Each of the transmitted pulse may include a plurality of cycles of a periodic signal, such as a sinusoidal signal. Thus, in order to control the frequency components or spectrum of the pulses, the amplitude and/or phase of the periodic signal should be controlled to meet the requirements. Additionally, since each pulse may only comprise a few cycles of a periodic signal, the control of the amplitude and/or phase of the signal should have relatively fine resolution, such as on a per cycle basis.

SUMMARY

An aspect of the disclosure relates to an apparatus for wireless communications comprising a signal generator adapted to generate a substantially periodic signal including a plurality of cycles, and a modulator adapted to modulate an amplitude, a phase or both the amplitude and the phase of the periodic signal on a per cycle basis. In another aspect, the modulator is adapted to modulate the amplitude, the phase, or both the amplitude and phase of the periodic signal with a defined modulation signal. In another aspect, the defined modulation signal includes a substantially root raised cosine signal. In another aspect, the defined modulation signal is configured to achieve a defined frequency spectrum for the modulated periodic signal.

In another aspect, the signal generator comprises a voltage controlled oscillator (VCO) adapted to generate the periodic signal. The signal generator may further comprise a calibration device adapted to calibrate the frequency of the periodic signal. In another aspect, the apparatus further comprises a timing module adapted to provide a timing signal to the modulator to control the modulation of the periodic signal on the per cycle basis. The timing module may further be adapted to receive a timing source signal from the signal generator. The timing module may further comprise sequential logic adapted to generate the timing signal in response to the timing source signal.

In another aspect, the modulator comprises a plurality of capacitors, a circuit adapted to charge the capacitors, and a switch network adapted to selectively couple one or more of the charged capacitors to an amplifier amplifying the periodic signal. The amplifier may comprise a power amplifier including a gain responsive to the modulating signal generated by the modulator.

Other aspects, advantages and novel features of the present disclosure will become apparent from the following detailed description of the disclosure when considered in conjunction with the accompanying drawings.

DETAILED DESCRIPTION

Various aspects of the disclosure are described below. It should be apparent that the teachings herein may be embodied in a wide variety of forms and that any specific structure, function, or both being disclosed herein are merely representative. Based on the teachings herein one skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein.

As an example of some of the above concepts, in some aspects, the apparatus may comprise a signal generator, such as a frequency-calibrated voltage controlled oscillator (VCO), adapted to generate a substantially periodic signal having a plurality of cycles. The apparatus may further comprise a modulator adapted to modulate an amplitude, a phase or both the amplitude and the phase of the periodic signal on a per cycle basis. The modulation may be based on a defined modulation signal, such as a substantially root raised cosine signal. The defined modulation signal may also be configured to achieve a defined frequency spectrum for the modulated periodic signal. The apparatus may be implemented as discrete elements, as an integrated circuit, and as a combination of one or more discrete elements and one or more integrated circuit. The apparatus may further be driven by a processor executing software to implement one or more of its functionality.

Figure 1A:
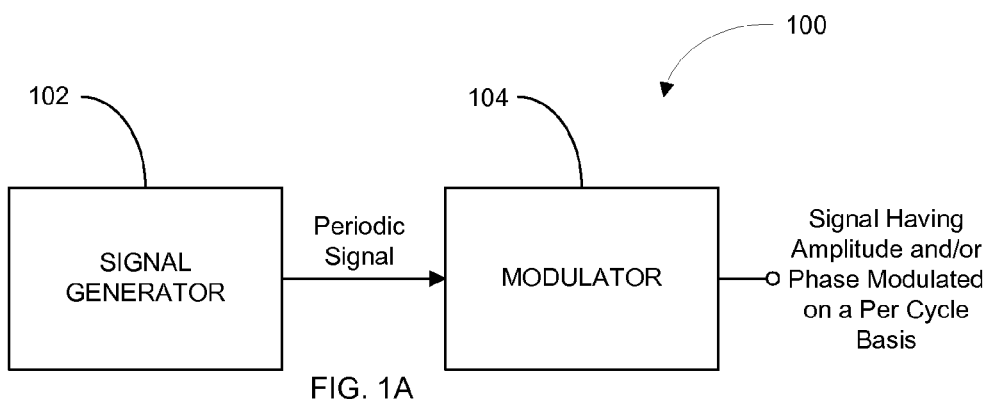
FIG. 1A illustrates a block diagram of an exemplary apparatus for modulating a substantially periodic signal on a per cycle basis in accordance with an aspect of the disclosure.

FIG. 1A illustrates a block diagram of an exemplary apparatus 100 for modulating a substantially periodic signal on a per cycle basis in accordance with an aspect of the disclosure. The apparatus 100 comprises a signal generator 102 adapted to generate a substantially periodic signal including a plurality of cycles T. The apparatus 100 further comprises a modulator 104 adapted to modulate an amplitude, phase, or both the amplitude and phase of the periodic signal on a per cycle basis.

As discussed in more detail below, by modulating the amplitude, phase, or both the amplitude and phase of the periodic signal on a per cycle basis, the apparatus 100 may generate a defined signal, such as a pulse comprising a plurality of cycles, with a specified amplitude and/or phase for each cycle of the pulse. Further, by properly selecting a defined pattern for the amplitude and/or phase for the cycles of the periodic signal, the apparatus 100 may generate a signal, such as a pulse, with a defined frequency spectrum. The defined frequency spectrum may be used to establish an ultra-wide band channel having a fractional bandwidth on the order of 20% or more, a bandwidth on the order of 500 MHz or more, or a fractional bandwidth on the order of 20% or more and a bandwidth on the order of 500 MHz or more.

Figure 1B:
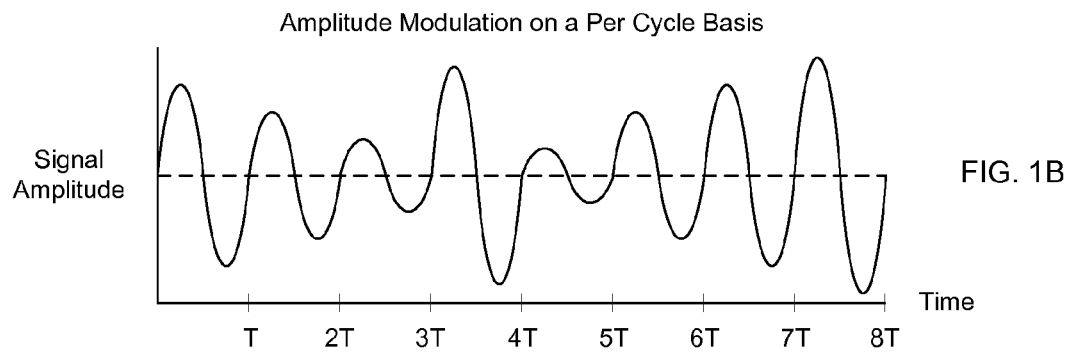
FIG. 1B illustrates a graph of an exemplary periodic signal including an amplitude modulated on a per cycle basis in accordance with another aspect of the disclosure.

FIG. 1B illustrates a graph of an exemplary periodic signal including an amplitude modulated on a per cycle basis in accordance with another aspect of the disclosure. As the graph illustrates, the apparatus 100 may generate a periodic signal having its amplitude modulated in a particular pattern. In this example, the apparatus 100 generates a signal including a first cycle (0-T) having a relatively high amplitude, a second cycle (T-2T) having a lower amplitude, a third cycle (2T-3T) with an even lower amplitude, and so on as shown in the graph. By controlling the amplitude of the periodic signal on a per cycle basis, the apparatus 100 is able to generate a defined signal with a defined frequency spectrum.

Figure 1C:
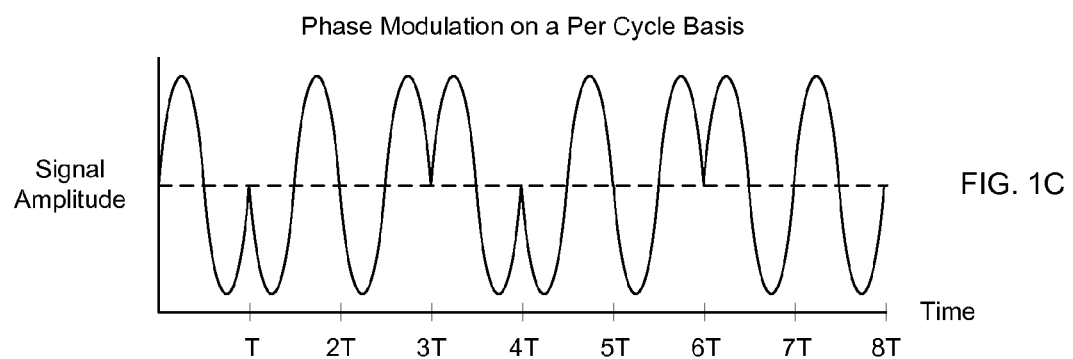
FIG. 1C illustrates a graph of an exemplary periodic signal including a phase modulated on a per cycle basis in accordance with another aspect of the disclosure.

FIG. 1C illustrates a graph of an exemplary periodic signal including a phase modulated on a per cycle basis in accordance with another aspect of the disclosure. As the graph illustrates, the apparatus 100 may generate a periodic signal having its phase modulated in a particular pattern. In this example, the apparatus 100 generates a signal including a first cycle (0-T) having a relative phase of zero (0) degree, a second cycle (T-2T) having a relative phase of 180 degrees, a third cycle (2T-3T) having a relative phase of 180 degrees, and so on as shown in the graph. Although, in this example, the phase of the periodic signal varied between two values (0 and 180), it shall be understood that the phase may be any value between zero (0) and 360 degrees. As per the amplitude modulation, by controlling the phase of the periodic signal on a per cycle basis, the apparatus 100 is able to generate a defined signal with a defined frequency spectrum.

Figure 1D:
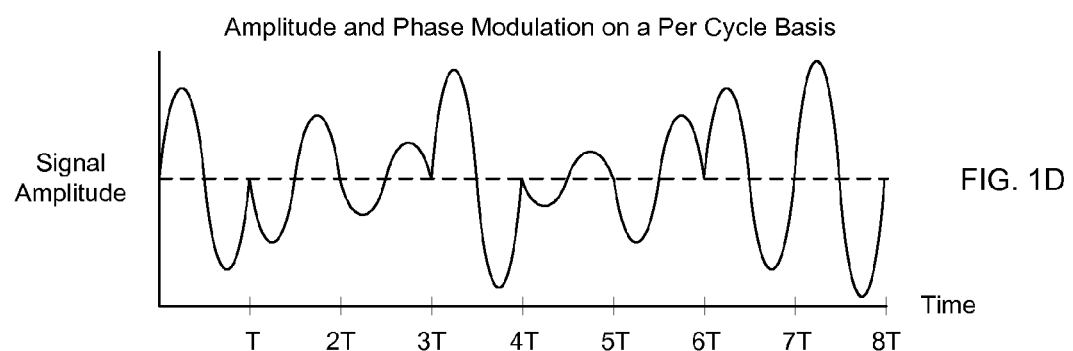
FIG. 1D illustrates a graph of an exemplary periodic signal including both an amplitude and phase modulated on a per cycle basis in accordance with another aspect of the disclosure.

FIG. 1D illustrates a graph of an exemplary periodic signal including an amplitude and a phase modulated on a per cycle basis in accordance with another aspect of the disclosure. As the graph illustrates, the apparatus 100 may generate a periodic signal having its amplitude and phase modulated in a particular pattern. In this example, the apparatus 100 generates a signal including a first cycle (0-T) having a relatively large amplitude and a relative phase of zero (0) degree, a second cycle (T-2T) having a lower amplitude and a relative phase of 180 degrees, a third cycle (2T-3T) having an even lower amplitude and a relative phase of 180 degrees, and so on as shown in the graph. As per the amplitude and phase modulations discussed above, by controlling the amplitude and phase of the periodic signal on a per cycle basis, the apparatus 100 is able to generate a defined signal with a defined frequency spectrum. For example, as discussed in more detail below, the apparatus 100 may modulate both the phase and amplitude to generate a substantially root raised cosine signal, which has a frequency spectrum having a relatively flat high amplitude portion centered approximately at the frequency of the periodic signal with relatively sharp drops in amplitude at defined frequencies above and below the center frequency.

Figure 2:
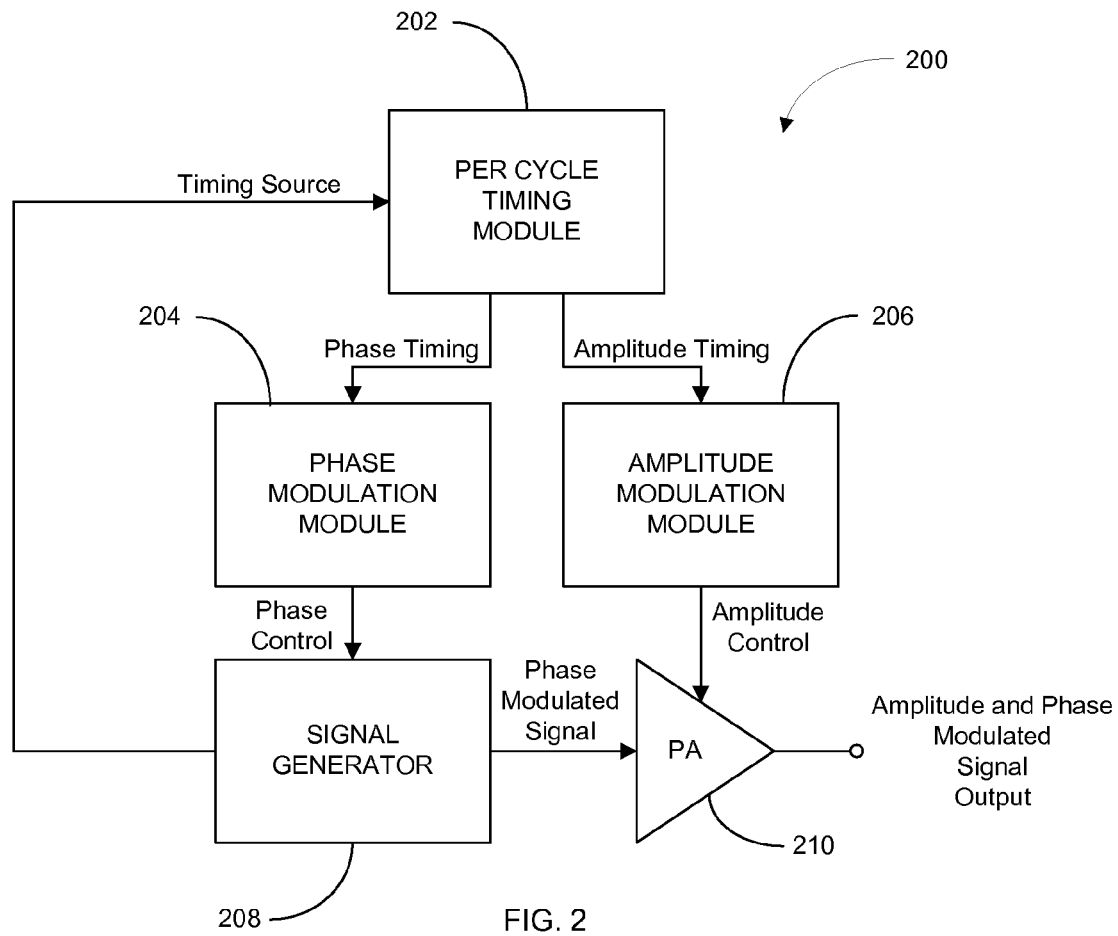
FIG. 2 illustrates a block diagram of another exemplary apparatus for modulating a substantially periodic signal on a per cycle basis in accordance with another aspect of the disclosure.

FIG. 2 illustrates a block diagram of another exemplary apparatus 200 for modulating a substantially periodic signal on a per cycle basis in accordance with an aspect of the disclosure. In this example, the apparatus 200 may be able to modulate the amplitude, phase, or both the amplitude and phase of a periodic signal. More specifically, the apparatus 200 comprises a per cycle timing module 202, a phase modulation module 204, an amplitude modulation module 206, a frequency-calibrated voltage controlled oscillator (VCO) 208, and a power amplifier (PA) 210.

The timing module 202 generates a phase timing signal and an amplitude timing signal based on a timing source signal received from the frequency-calibrated VCO 208. This ensures that the phase timing signal and amplitude timing signal are synchronized on a per cycle basis with the periodic signal generated by the VCO 208. The phase modulation module 204 generates a phase control signal that is timely based on the phase timing signal it receives from the timing module 202. The phase control signal modulates the phase of the periodic signal generated by the VCO 208. The amplitude modulation module 206 generates an amplitude control signal that is timely based on the amplitude timing signal it receives from the timing module 202. The amplitude control signal controls the gain of the power amplifier (PA) 210, and thus, modulates the amplitude of the periodic signal amplified by the power amplifier (PA) 210.

The frequency-calibrated VCO 208 generates the timing source signal for the per cycle timing module 202. The timing source signal may have a substantially fixed amplitude and a substantially fixed phase (e.g., a relative phase of zero (0) degree). The VCO 208 also generates a signal having a phase modulated by the phase control signal received from the phase modulation module 204. The phase modulated signal is substantially frequency synchronized with the timing source signal. The power amplifier (PA) 210 amplifies the phase modulated signal with a gain that varies with the amplitude control signal generated by the amplitude modulation module 206. Thus, the power amplifier (PA) 210 generates a signal having an amplitude and phase modulated on a per cycle basis.

In this example, the phase timing signal generated by the timing module 202 dictates when (e.g., which cycles) the phase changes of the signal generated by the apparatus 200. The phase control signal generated by the phase modulation module 204 dictates how much to change the relative phase of the signal. Since the phase control signal is based on the phase timing signal, it also dictates when the phase of the signal changes. Similarly, the amplitude timing signal generated by the timing module 202 dictates when (e.g., which cycles) the amplitude changes of the signal generated by the apparatus 200. The amplitude control signal generated by the amplitude modulation module 206 dictates how much to change the amplitude of the signal. Since the amplitude control signal is based on the amplitude timing signal, it also dictates when the amplitude of the signal changes.

Figure 3A:
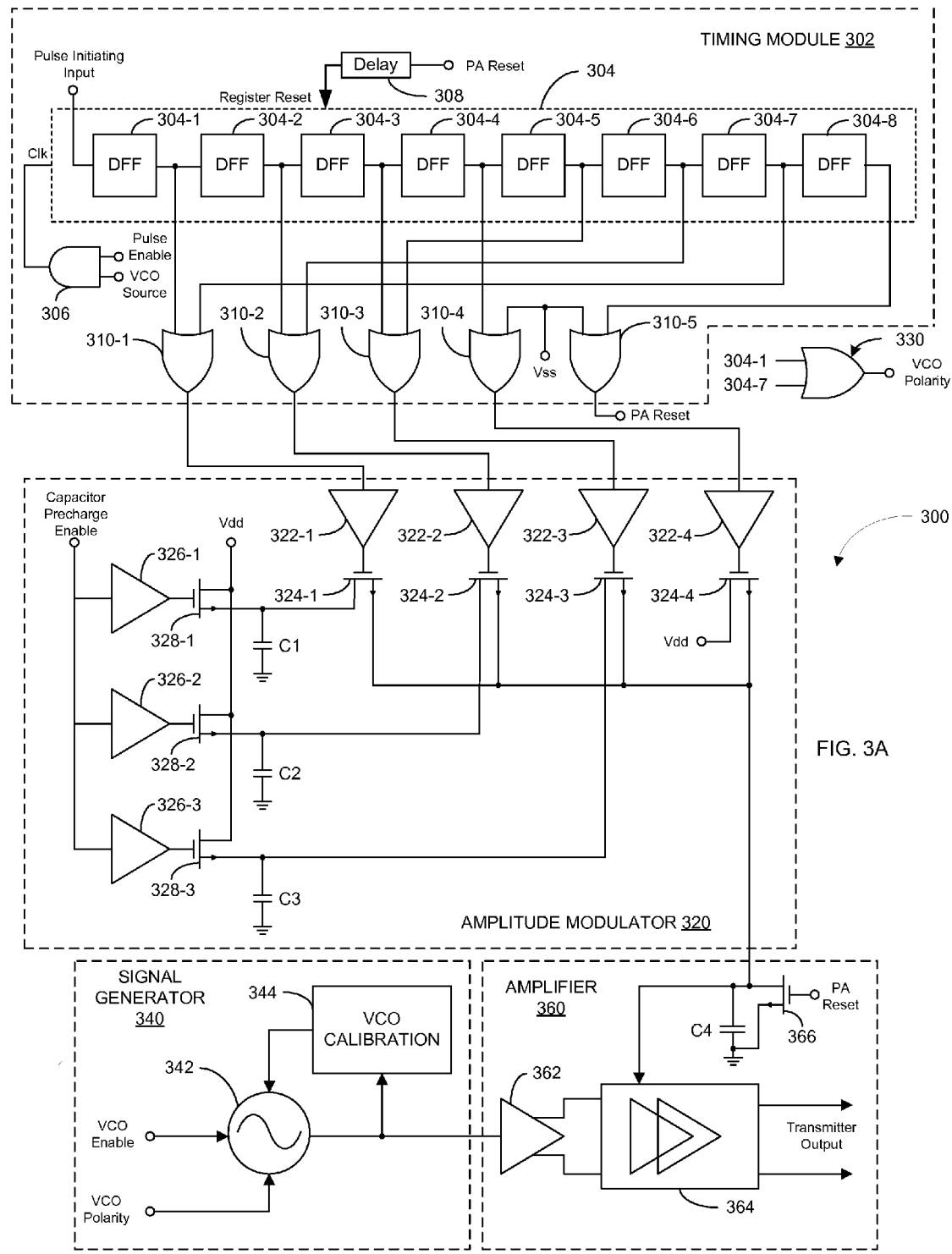
FIG. 3A illustrates a schematic diagram of another exemplary apparatus for modulating a substantially periodic signal on a per cycle basis in accordance with another aspect of the disclosure.

FIG. 3A illustrates a schematic diagram of another exemplary apparatus 300 for modulating an amplitude and phase of a substantially periodic signal on a per cycle basis in accordance with another aspect of the disclosure. The exemplary apparatus 300 may be a more detailed exemplary aspect of the apparatus 100 or 200 previously discussed. The apparatus 300 comprises a timing module 302, an amplitude modulator 320, a phase modulator 330, a signal generator 340, and an amplifier 360.

The timing module 302 generates amplitude and phase timing signals for controlling the modulating of the amplitude and phase of a substantially periodic signal generated by the signal generator 340. The amplitude modulator 320 controls the gain of the amplifier 360 in response to the amplitude timing signals generated by the timing module 302 in order to modulate the amplitude of the periodic signal on a per cycle basis. The phase modulator 330 controls the phase of the periodic signal generated by the signal generator 340. The signal generator 340 generates a substantially periodic signal having a phase modulated or controlled by the phase timing signal (VCO Polarity) generated by the phase modulator 330. The signal generator 340 also generates a timing source signal (VCO Source Input) for the timing module 302 to generate the timing signals. The amplifier 360 amplifies the phase modulated signal generated by the signal generator 340 and also modulates the amplitude of the signal in response to the amplitude modulation signal generated by the amplitude modulator 320.

More specifically, the timing module 302 comprises a shift register 304 including a plurality of D-flip-flops (DFF) 304-1 through 304-8, an AND-gate 306, a delay element 308, and a plurality of OR-gates 310-1 through 310-5. The shift register 304 is clocked by the timing source signal (VCO Source Input) generated by the signal generator 340. The AND-gate 306 includes a pulse enable input and a VCO source input. The AND-gate 306 includes an output coupled to the clock input of the shift register 304. The shift register 304 also includes a register reset input adapted to receive a Power Amplifier (PA) reset signal via the delay element 308. The input of the first DFF 304-1 is adapted to receive a pulse initiating input. The OR-gate 310-1 includes a first input coupled to the output of the first DFF 304-1 and a second input coupled to the output of the seventh DFF 304-7. The OR-gate 310-2 includes a first input coupled to the output of the second DFF 304-2 and a second input coupled to the output of the sixth DFF 304-6. The OR-gate 310-3 includes a first input coupled to the output of the third DFF 304-3 and a second input coupled to the output of the fifth DFF 304-5. The OR-gate 310-4 includes a first input coupled to the output of the fourth DFF 304-4 and a second input coupled to a logic low voltage Vss. The OR-gate 310-5 includes a first input coupled to the logic low voltage Vss and a second input coupled to the output of the eighth DFF 304-8.

The amplitude modulator 320, in turn, comprises a first set of drivers 322-1 through 322-4, a first set of field effect transistors (FETs) 324-1 through 324-4, a second set of drivers 326-1 through 326-3, a second set of FETs 328-1 through 328-3, and a set of capacitors C1 through C3. The inputs of the first set of drivers 322-1 through 322-4 are respectively coupled to the outputs of the OR-gates 310-1 through 310-4 of the timing module 302. The outputs of the first set of drivers 322-1 through 322-4 are respectively coupled to the gates of the first set of FETs 324-1 through 324-4. The inputs of the second set of drivers 326-1 through 326-3 are adapted to receive a capacitor precharge enable pulse. The outputs of the second set of drivers 326-1 through 326-3 are respectively coupled to the gates of the second set of FETs 328-1 through 328-3. The drains of the second set of FETs 328-1 to 328-3 are adapted to receive a bias voltage Vdd. The sources of the second set of FETs 328-1 to 328-3 are respectively coupled to capacitors C1 through C3, and respectively to the drains of the FETs 322-1 through 322-3. The drain of FET 322-4 is adapted to receive the bias voltage Vdd.

The phase modulator 330 may be configured as an OR-gate having a first input coupled to the output of the first DFF 304-1, a second input coupled to the output of the seventh DFF 304-7, and an output adapted to generate a phase control signal (VCO Polarity).

The signal generator 340, in turn, comprises a voltage controlled oscillator (VCO) 342 and a VCO calibration unit 344. The VCO calibration unit 344 generates a frequency tuning signal for the VCO 342 in response to sensing the frequency of the substantially periodic signal generated by the VCO 342. The VCO 342 is also adapted to receive a VCO enable signal for enabling the VCO to generate the periodic signal. This is useful for low power application where the VCO is enabled only during times when a signal, such as a pulse, is being transmitted. The VCO 342 is further adapted to change the relative phase of the periodic signal between 0 and 180 degrees in response to the phase control signal (VCO Polarity) generated by the phase modulator 330. Additionally, the VCO 342 is adapted to generate a VCO source signal for the timing module 302 and for the amplifier module 360. In one aspect, the VCO source signal includes a substantially fixed amplitude and a relative phase of substantially zero (0) degree. In a second aspect, the VCO source signal includes a substantially fixed amplitude and a relative phase of substantially 180 degree.

The amplifier 360, in turn, comprises a pre-amplifier 362, a power amplifier 364, a capacitor C4, and a FET 366. The pre-amplifier 362 is coupled to the output of the VCO 342 in order to receive and amplify the phase-modulated periodic signal. The input of the power amplifier 364 is coupled to the output of the pre-amplifier 362 to further amplify the phase-modulated periodic signal as well as amplitude modulate the signal in response to the amplitude control signal generated by the amplitude modulator 320. The capacitor C4 is coupled between the bias terminal of the power amplifier 364 and ground. The source and drain of the FET 366 are coupled in parallel with capacitor C4. The gate of the FET 366 is adapted to receive the PA Reset signal generated by the OR-gate 310-5 of the timing module 302. The capacitor C4 is adapted to receive the amplitude control signal generated by the amplitude modulator 320. The following explains the operation of the apparatus 300 in generating a substantially root raised cosine pulse. It shall be understood that the apparatus 300 may be configured to generate other types of signals.

Figure 3B:
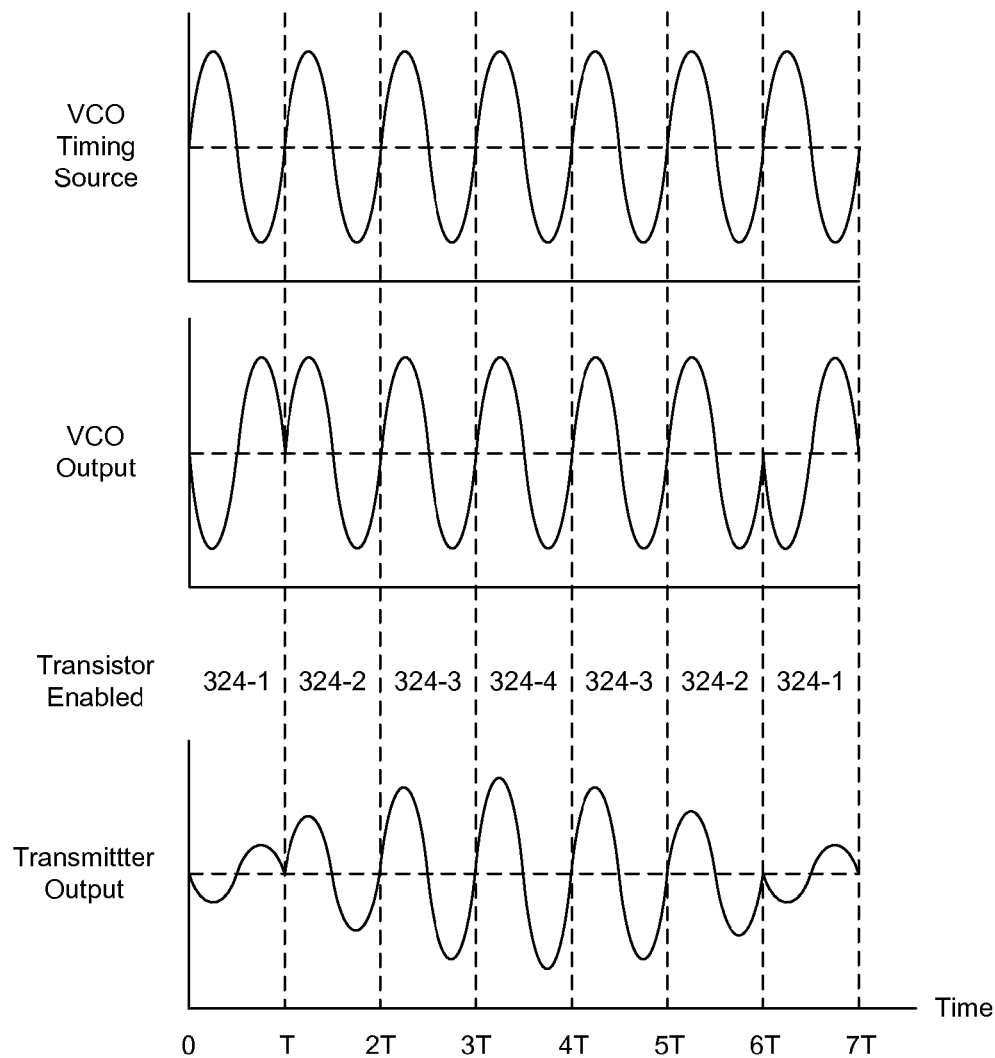
FIG. 3B illustrates a graph of various signals generated in the exemplary apparatus for modulating a substantially periodic signal on a per cycle basis in accordance with another aspect of the disclosure.

FIG. 3B illustrates a graph of various signals generated in the exemplary apparatus 300 for modulating a substantially periodic signal on a per cycle basis in accordance with another aspect of the disclosure. The x- or horizontal axis of the graphs represents time, and in particular, seven (7) cycles of the periodic signal generated by the VCO 342. The top graph illustrates the VCO timing source signal generated by the VCO 342, which is substantially sinusoidal with a substantially fixed amplitude and a relative phase of substantially zero (0) degree. The second graph illustrates the phase-modulated signal generated by the VCO 342 in response to the phase control signal (VCO Polarity) generated by the phase modulator 330. The third representation indicates which FET of the amplitude modulator 320 is enabled. The last graph illustrates the output of the apparatus 300.

With reference to both FIGS. 3A and 3B, prior to time zero (0) before a signal, such as a pulse, is to be generated, the charge precharge enable pulse is applied to the gates of the FETs 328-1 through 328-3 via the drivers 326-1 through 326-3, respectively. This turns on the FETs 328-1 through 328-3 so that the bias voltage Vdd is applied across the capacitors C1 through C3 in order to precharge them. The capacitors C1 through C3 are selected to generate a particular amplitude envelope for the signal generated by the apparatus 300. In this particular example of generating a root raised cosine signal, the capacitors C1 through C3 may have capacitance C4/10, C4/5, and C4/2, where C4 is the bias capacitor for the power amplifier 364. Also, prior to time zero (0) before the signal is to be generated, the PA Reset signal would have been applied to the gate of FET 366 in order to ground the capacitor C4 and remove all charges therefrom, as well as to the Register Reset input of the shift register 304 to load the register with logic low levels, which, in turn, causes FETs 324-1 through 324-4 of the amplitude modulator 320 to be turned off.

Then, at time zero (0), a logic high level from the pulse enable signal is applied to the input of the AND-gate 306 which, in turn, conveys the VCO source input to the input of the shift register 304. The shift register 304, in turn, transfers the logic high level (received from the pulse initiating input) at the input of DFF 304-1 to its output and to the inputs of the DFF 304-2 and OR-gate 310-1 in response to the VCO Source signal. The OR-gate 310-1, in turn, transfers the logic high level to the gate of FET 324-1 via the driver 322-1 of the amplitude modulator 320. In response to the logic high level, the FET 324-1 turns on and couples the pre-charged capacitor C1 in parallel with capacitor C4 of the amplifier 360. Thus, the charge on capacitor C1 is transferred to capacitor C4, and thus produces a bias voltage for the power amplifier 364 to amplify the signal generated by the signal generator 340. Also, at time zero (0), the phase modulator 330 produces a VCO Polarity signal that causes the VCO 342 to generate a relative phase of substantially 180 degrees. Thus, as the graph of FIG. 3B illustrates, the apparatus 300 generates, between time interval zero (0) to T, a cycle of a substantially sinusoidal signal with a relative phase of substantially 180 degrees having an amplitude related to the charge that was transferred from capacitor C1 to C4.

At time T, the pulse initiating input is at the logic low level. Thus, the VCO source signal clocks the logic low level to the inputs of DFF 304-2 and the OR-gate 310-1. The OR-gate 310-1, in turn, transfers the logic low level to the gate of FET 324-1 via the driver 322-1. In response to the logic low level, the FET 324-1 turns off, and decouples the discharged capacitor C1 from capacitor C4. Also, at time T, the VCO source signal clocks the logic high level at the input of the DFF 304-2 to the inputs of DFF 304-3 and OR-gate 310-2. The OR-gate 310-2, in turn, transfers the logic high level to the gate of FET 324-2 via the driver 322-2 of the amplitude modulator 320. In response to the logic high level, the FET 324-2 turns on and couples the pre-charged capacitor C2 in parallel with capacitor C4 of the amplifier 360. Thus, the charge on capacitor C2 is transferred to capacitor C4, and thus produces a higher bias voltage for the power amplifier 364 to amplify the signal generated by the signal generator 340. Also, at time T, the phase modulator 330 produces a VCO Polarity signal that causes the VCO 342 to generate a relative phase of substantially zero (0) degree. Thus, as the graph of FIG. 3B illustrates, the apparatus 300 generates, between time T and 2T, a cycle of a substantially sinusoidal signal with a relative phase of substantially zero (0) degree having an amplitude related to the charge that was transferred from capacitor C2 to C4.

At time 2T, the pulse initiating input is again at the logic low level. Thus, the VCO source signal clocks the logic low level to the inputs of DFF 304-2 and the OR-gate 310-1. The OR-gate 310-1, in turn, transfers the logic low level to the gate of FET 324-1 via the driver 322-1 to maintain the FET 324-1 in its off state, thereby keeping discharged capacitor C1 decoupled from capacitor C4. Also, at time 2T, the VCO source signal clocks the logic low level at the input of DFF 304-2 to the inputs of DFF 304-3 and the OR-gate 310-2. The OR-gate 310-2, in turn, transfers the logic low level to the gate of FET 324-2 via the driver 322-2. In response to the logic low level, the FET 324-2 turns off, and decouples the discharged capacitor C2 from capacitor C4.

Additionally, at time 2T, the VCO source signal clocks the logic high level at the input of the DFF 304-3 to the inputs of DFF 304-4 and OR-gate 310-3. The OR-gate 310-3, in turn, transfers the logic high level to the gate of FET 324-3 via the driver 322-3 of the amplitude modulator 320. In response to the logic high level, the FET 324-3 turns on and couples the pre-charged capacitor C3 in parallel with capacitor C4 of the amplifier 360. Thus, the charge on capacitor C3 is transferred to capacitor C4, and thus produces an even higher bias voltage for the power amplifier 364 to amplify the signal generated by the signal generator 340. Also, at time 2T, the phase modulator 330 produces a VCO Polarity signal that causes the VCO 342 to generate a relative phase of substantially zero (0) degree. Thus, as the graph of FIG. 3B illustrates, the apparatus 300 generates, between time 2T and 3T, a cycle of a substantially sinusoidal signal with a relative phase of substantially zero (0) degree having an amplitude related to the charge that was transferred from capacitor C3 to C4.

At time 3T, the pulse initiating input is again at the logic low level. Thus, the VCO source signal clocks the logic low level to the inputs of DFF 304-2 and the OR-gate 310-1. The OR-gate 310-1, in turn, transfers the logic low level to the gate of FET 324-1 via the driver 322-1 to maintain the FET 324-1 in its off state, thereby keeping discharged capacitor C1 decoupled from capacitor C4. Also, at time 3T, the VCO source signal clocks the logic low level at the input of DFF 310-2 to the inputs of DFF 304-3 and the OR-gate 310-2. The OR-gate 310-2, in turn, transfers the logic low level to the gate of FET 324-2 via the driver 322-2 to maintain the FET 324-2 in its off state, thereby keeping discharged capacitor C2 decoupled from capacitor C4. Also, at time 3T, the VCO source signal clocks the logic low level at the input of DFF 310-3 to the inputs of DFF 304-4 and the OR-gate 310-3. The OR-gate 310-3, in turn, transfers the logic low level to the gate of FET 324-3 via the driver 322-3. In response to the logic low level, the FET 324-3 turns off, and decouples the discharged capacitor C3 from capacitor C4.

Additionally, at time 3T, the VCO source signal clocks the logic high level at the input of the DFF 304-4 to the inputs of DFF 304-5 and OR-gate 310-4. The OR-gate 310-4, in turn, transfers the logic high level to the gate of FET 324-4 via the driver 322-4 of the amplitude modulator 320. In response to the logic high level, the FET 324-4 turns on and couples the power supply voltage Vdd to capacitor C4 of the amplifier 360. Thus, the power supply voltage Vdd fully charges the capacitor C4, and thus produces an even higher bias voltage for the power amplifier 364 to amplify the signal generated by the signal generator 340. Also, at time 3T, the phase modulator 330 produces a VCO Polarity signal that causes the VCO 342 to generate a relative phase of substantially zero (0) degree. Thus, as the graph of FIG. 3B illustrates, the apparatus 300 generates, between time 3T and 4T, a cycle of a substantially sinusoidal signal with a relative phase of substantially zero (0) degree having an amplitude related to the charge transferred from the power supply voltage Vdd to capacitor C4.

At time 4T, the pulse initiating input is again at the logic low level. Thus, the VCO source signal clocks logic low levels to the inputs of OR-gates 310-1, 310-2, and 310-4. Thus, as previously discussed, FETs 324-1, 324-2, and 324-4 are turned off, thereby decoupling the capacitors C1 and C2 and the power supply voltage Vdd from capacitor C4. However, at time 4T, the VCO source signal clocks the logic high level at the input of DFF 304-5 to the inputs of DFF 304-6 and OR-gate 310-3. The OR-gate 310-3, in turn, transfers the logic high level to the gate of FET 324-3 via the driver 322-3 of the amplitude modulator 320. In response to the logic high level, the FET 324-3 turns on and couples the discharged capacitor C3 in parallel with capacitor C4 of the amplifier 360. In this case, some of the charge that was on capacitor C4 transfers to C3, thereby reducing the charge on capacitor C4. This produces a lower bias voltage for the power amplifier 364 to amplify the signal generated by the signal generator 340. Also, at time 4T, the phase modulator 330 produces a VCO Polarity signal that causes the VCO 342 to generate a relative phase of substantially zero (0) degree. Thus, as the graph of FIG. 3B illustrates, the apparatus 300 generates, between time 4T and 5T, a cycle of a substantially sinusoidal signal with a relative phase of substantially zero (0) degree having an amplitude related to the charge transferred from capacitor C4 to capacitor C3.

At time 5T, the pulse initiating input is again at the logic low level. Thus, the VCO source signal clocks logic low levels to the inputs of OR-gates 310-1, 310-3, and 310-4. Thus, as previously discussed, FETs 324-1, 324-3, and 324-4 are turned off, thereby decoupling the capacitors C1 and C3 and the power supply voltage Vdd from capacitor C4. However, at time 5T, the VCO source signal clocks the logic high level at the input of DFF 304-6 to the inputs of DFF 304-7 and OR-gate 310-2. The OR-gate 310-2, in turn, transfers the logic high level to the gate of FET 324-2 via the driver 322-2 of the amplitude modulator 320. In response to the logic high level, the FET 324-2 turns on and couples the discharged capacitor C2 in parallel with capacitor C4 of the amplifier 360. In this case, some of the charge that was on capacitor C4 transfers to C2, thereby further reducing the charge on capacitor C4. This produces a lower bias voltage for the power amplifier 364 to amplify the signal generated by the signal generator 340. Also, at time 5T, the phase modulator 330 produces a VCO Polarity signal that causes the VCO 342 to generate a relative phase of substantially zero (0) degree. Thus, as the graph of FIG. 3B illustrates, the apparatus 300 generates, between time 5T and 6T, a cycle of a substantially sinusoidal signal with a relative phase of substantially zero (0) degree having an amplitude related to the charge transferred from capacitor C4 to capacitor C2.

At time 6T, the pulse initiating input is at the logic low level. Thus, the VCO source signal clocks logic low levels to the inputs of OR-gates 310-2, 310-3, and 310-4. Thus, as previously discussed, FETs 324-2, 324-3, and 324-4 are turned off, thereby decoupling the capacitors C2 and C3 and the power supply voltage Vdd from capacitor C4. However, at time 6T, the VCO source signal clocks the logic high level at the input of OR-gate 304-7 to the inputs of DFF 304-8 and OR-gate 310-1. The OR-gate 310-1, in turn, transfers the logic high level to the gate of FET 324-1 via the driver 322-1 of the amplitude modulator 320. In response to the logic high level, the FET 324-1 turns on and couples the discharged capacitor C1 in parallel with capacitor C4 of the amplifier 360. In this case, some of the charge that was on capacitor C4 transfers to C1, thereby further reducing the charge on capacitor C4. This produces a lower bias voltage for the power amplifier 364 to amplify the signal generated by the signal generator 340. Also, between time 6T and 7T, the phase modulator 330 produces a VCO Polarity signal that causes the VCO 342 to generate a relative phase of substantially 180 degrees. Thus, as the graph of FIG. 3B illustrates, the apparatus 300 generates, between time 6T and 7T, a cycle of a substantially sinusoidal signal with a relative phase of substantially 180 degrees having an amplitude related to the charge transferred from capacitor C4 to capacitor C1.

After time 7T, the VCO source signal transfers logic low levels to the inputs of OR-gates 310-1 through 310-4. This effectively decouples the capacitors C1-3 and the voltage Vdd from capacitor C4. Also, at this time, the VCO source signal transfers the logic high level from the input to the output of DFF 304-8 and the input of OR-gate 310-5. This causes the OR-gate 310-5 to generate a logic high level PA Reset signal. The PA Reset signal, in turn, causes FET 366 to turn on, thereby grounding capacitor C4 and removing substantially all charges from the capacitor C4. This resets the capacitor C4 for the next signal generating process. Also, after a time delay dictated by the delay element 308, the PA Reset signals resets the shift register 304 in order to load the register with all logic low signals.

Figure 3C:
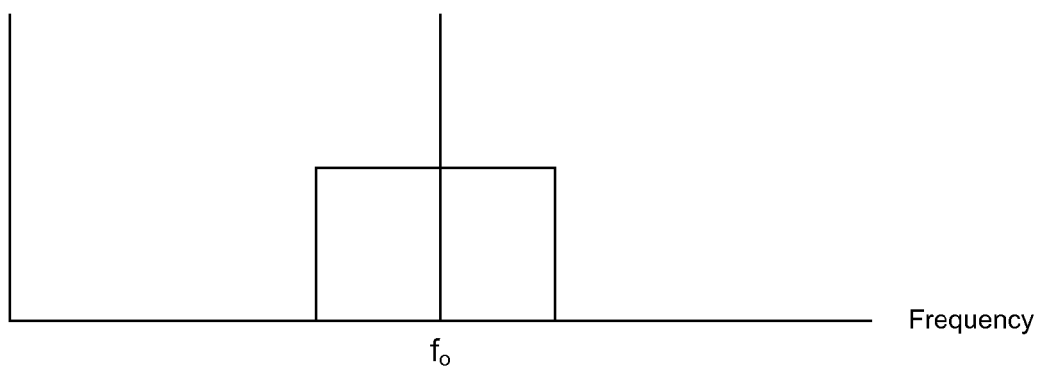
FIG. 3C illustrates a graph of an exemplary frequency spectrum of one exemplary modulated signal generated by the exemplary apparatus for modulating a substantially periodic signal on a per cycle basis in accordance with another aspect of the disclosure.

FIG. 3C illustrates a graph of an exemplary approximate frequency spectrum of one exemplary modulated signal generated by the exemplary apparatus 300 for modulating a substantially periodic signal on a per cycle basis in accordance with another aspect of the disclosure. As discussed above, the apparatus 300 generates a signal, such as a pulse, comprising a plurality of cycles with defined amplitude and phase requirements. In this example, the amplitude of the signal increases in a defined manner (e.g., A/10, A/5, A/2, A) from cycles 0 to 4T and decreases in a defined manner (e.g., A, A/2, A/5, A/10) from cycles 4T to 7T. Also, in this example, the phase of the signal at intervals 0 to T and 6T to 7T is substantially 180 degrees out of phase of the signal at intervals T to 6T. This is done to achieve a substantially root raised cosine signal. As shown in FIG. 3C, the root raised cosine signal produces a defined frequency spectrum having a substantially flat amplitude region above and below the frequency $f_0$ of the periodic signal with sharp drops in amplitudes at the ends of the flat amplitude region. It shall be understood that the apparatus 300 may be configured to generate other defined signals having defined frequency spectrums.

Figure 4:
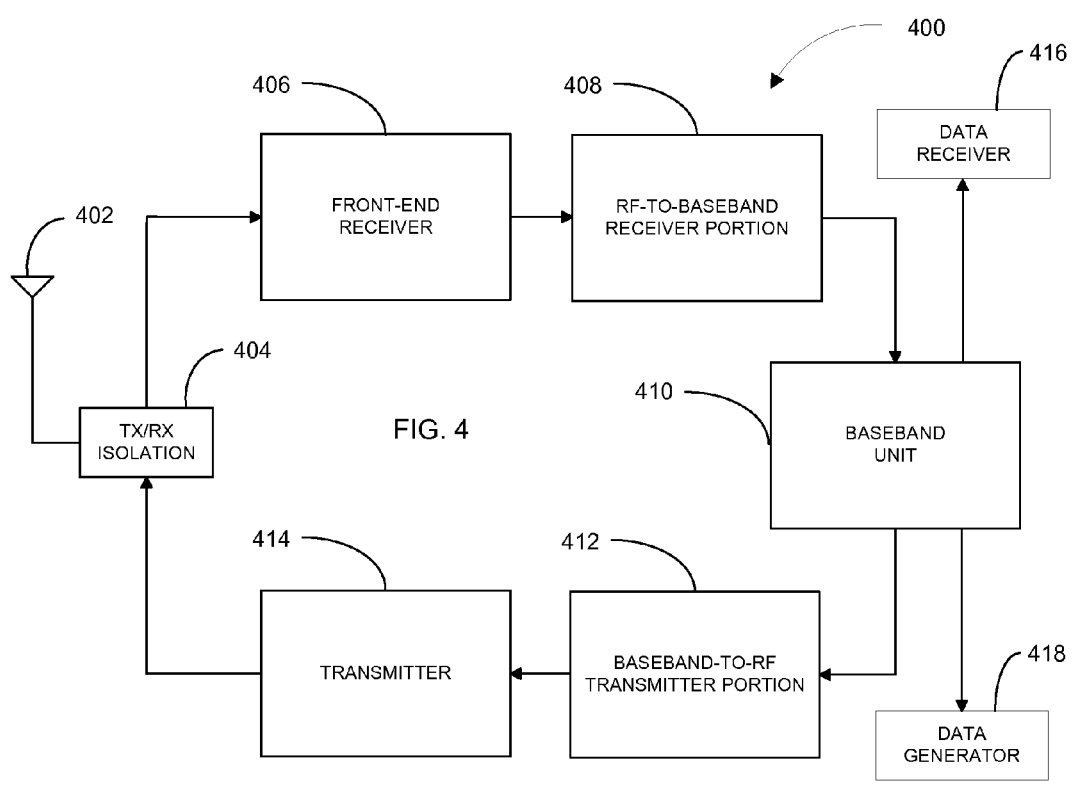
FIG. 4 illustrates a block diagram of an exemplary communications device in accordance with another aspect of the disclosure.

FIG. 4 illustrates a block diagram of an exemplary communications device 400 including an exemplary transceiver in accordance with another aspect of the disclosure. The communications device 400 may be particularly suited for sending and receiving data to and from other communications devices. The communications device 400 comprises an antenna 402, a Tx/Rx isolation device 404, a front-end receiver portion 406, an RF-to-baseband receiver portion 408, a baseband unit 410, a baseband-to-RF transmitter portion 412, a transmitter 414, a data receiver 416, and a data generator 418. The transmitter 414 may include an apparatus, such as apparatuses 100, 200, and 300, to generate a defined signal, such as a pulse, having an amplitude and/or phase modulated on a per cycle basis as previously discussed. Accordingly, the transmitter 414 is able to transmit a defined signal having a defined frequency spectrum.

In operation, the data processor 416 may receive data from another communications device via the antenna 402 which picks up the RF signal from the communications device, the Tx/Rx isolation device 404 which sends the signal to the front-end receiver portion 406, the receiver front-end 406 which amplifies the received signal, the RF-to-baseband receiver portion 408 which converts the RF signal into a baseband signal, and the baseband unit 410 which processes the baseband signal to determine the received data. The data receiver 416 may then perform one or more defined operations based on the received data. For example, the data processor 416 may include a microprocessor, a microcontroller, a reduced instruction set computer (RISC) processor, a display, an audio device, such as a headset, including a transducer such as speakers, a medical device, a shoe, a watch, a robotic or mechanical device responsive to the data, a user interface, such as a display, one or more light emitting diodes (LED), etc.

Further, in operation, the data generator 418 may generate outgoing data for transmission to another communications device via the baseband unit 410 which processes the outgoing data into a baseband signal for transmission, the baseband-to-RF transmitter portion 412 which converts the baseband signal into an RF signal, the transmitter 414 which conditions the RF signal for transmission via the wireless medium, the Tx/Rx isolation device 404 which routes the RF signal to the antenna 402 while isolating the input to the receiver front-end 406, and the antenna 402 which radiates the RF signal to the wireless medium. The data generator 418 may be a sensor or other type of data generator. For example, the data generator 418 may include a microprocessor, a microcontroller, a RISC processor, a keyboard, a pointing device such as a mouse or a track ball, an audio device, such as a headset, including a transducer such as a microphone, a medical device, a shoe, a robotic or mechanical device that generates data, a user interface, such as a display, one or more light emitting diodes (LED), etc.

Figure 5:
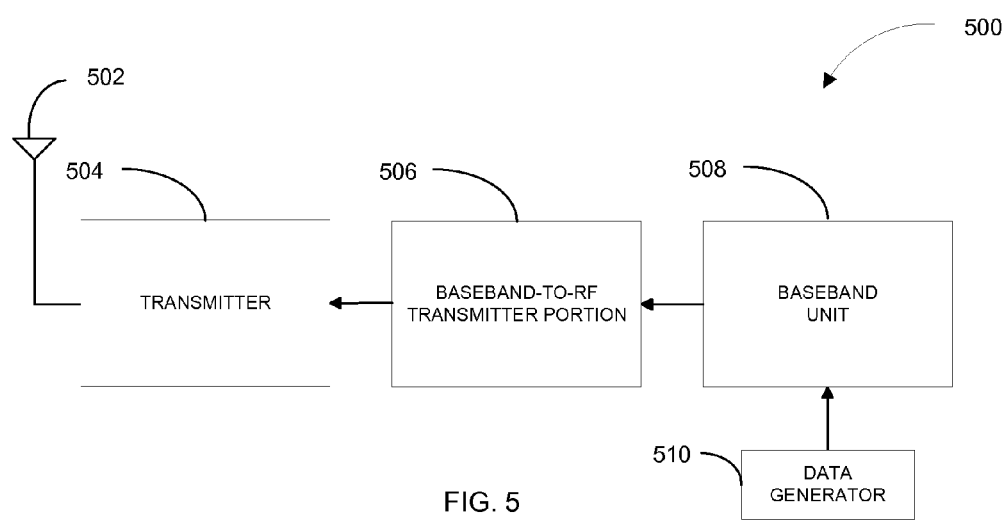
FIG. 5 illustrates a block diagram of another exemplary communications device in accordance with another aspect of the invention.

FIG. 5 illustrates a block diagram of an exemplary communications device 500 including an exemplary transceiver in accordance with another aspect of the disclosure. The communications device 500 may be particularly suited for sending data to other communications devices. The communications device 500 comprises an antenna 502, a transmitter 504, a baseband-to-RF transmitter portion 506, a baseband unit 508, and a data generator 510. The transmitter 504 may include an apparatus, such as apparatuses 100, 200, and 300, to generate a defined signal, such as a pulse, having an amplitude and/or phase modulated on a per cycle basis as previously discussed. Accordingly, the transmitter 414 is able to transmit a defined signal having a defined frequency spectrum.

In operation, the data generator 510 may generate outgoing data for transmission to another communications device via the baseband unit 508 which processes the outgoing data into a baseband signal for transmission, the baseband-to-RF transmitter portion 506 which converts the baseband signal into an RF signal, the transmitter 504 which conditions the RF signal for transmission via the wireless medium, and the antenna 502 which radiates the RF signal to the wireless medium. The data generator 510 may be a sensor or other type of data generator. For example, the data generator 510 may include a microprocessor, a microcontroller, a RISC processor, a keyboard, a pointing device such as a mouse or a track ball, an audio device including a transducer such as a microphone, a medical device, a shoe, a robotic or mechanical device that generates data, a user interface, such as a display, one or more light emitting diodes (LED), etc.

Figure 6A:
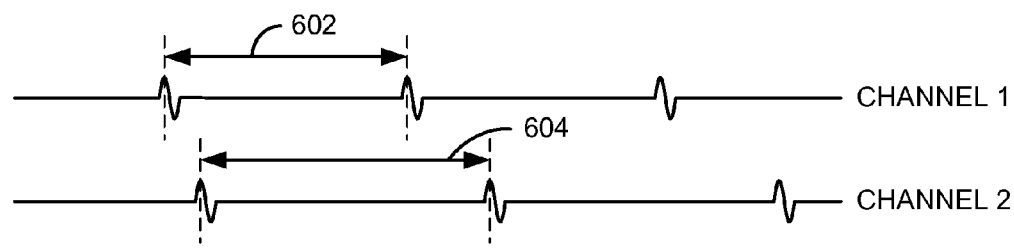
FIGS. 6A-D illustrate timing diagrams of various pulse modulation techniques in accordance with another aspect of the disclosure.

FIG. 6A illustrates different channels (channels 1 and 2) defined with different pulse repetition frequencies (PRF) as an example of a PDMA modulation. Specifically, pulses for channel 1 have a pulse repetition frequency (PRF) corresponding to a pulse-to-pulse delay period 602. Conversely, pulses for channel 2 have a pulse repetition frequency (PRF) corresponding to a pulse-to-pulse delay period 604. This technique may thus be used to define pseudo-orthogonal channels with a relatively low likelihood of pulse collisions between the two channels. In particular, a low likelihood of pulse collisions may be achieved through the use of a low duty cycle for the pulses. For example, through appropriate selection of the pulse repetition frequencies (PRF), substantially all pulses for a given channel may be transmitted at different times than pulses for any other channel.

The pulse repetition frequency (PRF) defined for a given channel may depend on the data rate or rates supported by that channel. For example, a channel supporting very low data rates (e.g., on the order of a few kilobits per second or Kbps) may employ a corresponding low pulse repetition frequency (PRF). Conversely, a channel supporting relatively high data rates (e.g., on the order of a several megabits per second or Mbps) may employ a correspondingly higher pulse repetition frequency (PRF).

Figure 6B:
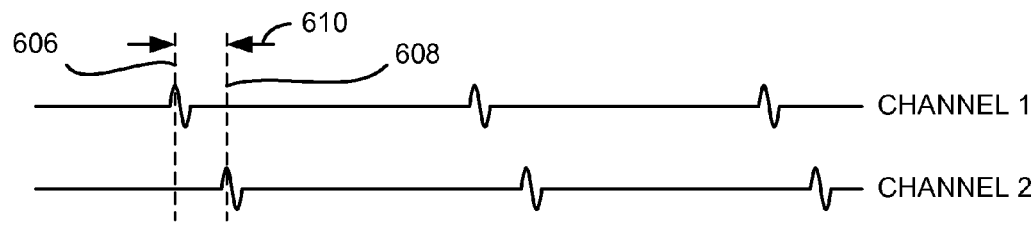

FIG. 6B illustrates different channels (channels 1 and 2) defined with different pulse positions or offsets as an example of a PDMA modulation. Pulses for channel 1 are generated at a point in time as represented by line 606 in accordance with a first pulse offset (e.g., with respect to a given point in time, not shown). Conversely, pulses for channel 2 are generated at a point in time as represented by line 608 in accordance with a second pulse offset. Given the pulse offset difference between the pulses (as represented by the arrows 610), this technique may be used to reduce the likelihood of pulse collisions between the two channels. Depending on any other signaling parameters that are defined for the channels (e.g., as discussed herein) and the precision of the timing between the devices (e.g., relative clock drift), the use of different pulse offsets may be used to provide orthogonal or pseudo-orthogonal channels.

Figure 6C:
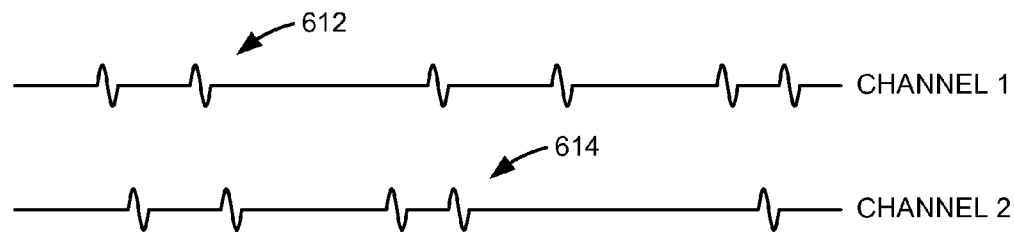

FIG. 6C illustrates different channels (channels 1 and 2) defined with different timing hopping sequences. For example, pulses 612 for channel 1 may be generated at times in accordance with one time hopping sequence while pulses 614 for channel 2 may be generated at times in accordance with another time hopping sequence. Depending on the specific sequences used and the precision of the timing between the devices, this technique may be used to provide orthogonal or pseudo-orthogonal channels. For example, the time hopped pulse positions may not be periodic to reduce the possibility of repeat pulse collisions from neighboring channels.

Figure 6D:
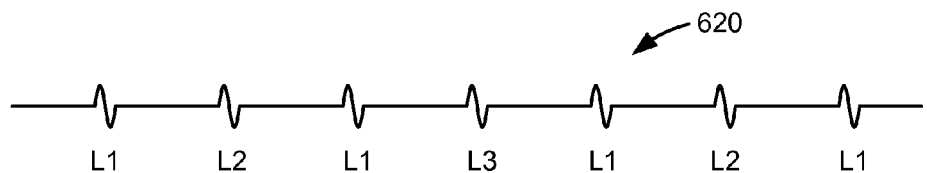

FIG. 6D illustrates different channels defined with different time slots as an example of a PDM modulation. Pulses for channel L1 are generated at particular time instances. Similarly, pulses for channel L2 are generated at other time instances. In the same manner, pulse for channel L3 are generated at still other time instances. Generally, the time instances pertaining to the different channels do not coincide or may be orthogonal to reduce or eliminate interference between the various channels.

It should be appreciated that other techniques may be used to define channels in accordance with a pulse modulation schemes. For example, a channel may be defined based on different spreading pseudo-random number sequences, or some other suitable parameter or parameters. Moreover, a channel may be defined based on a combination of two or more parameters.

Figure 7:
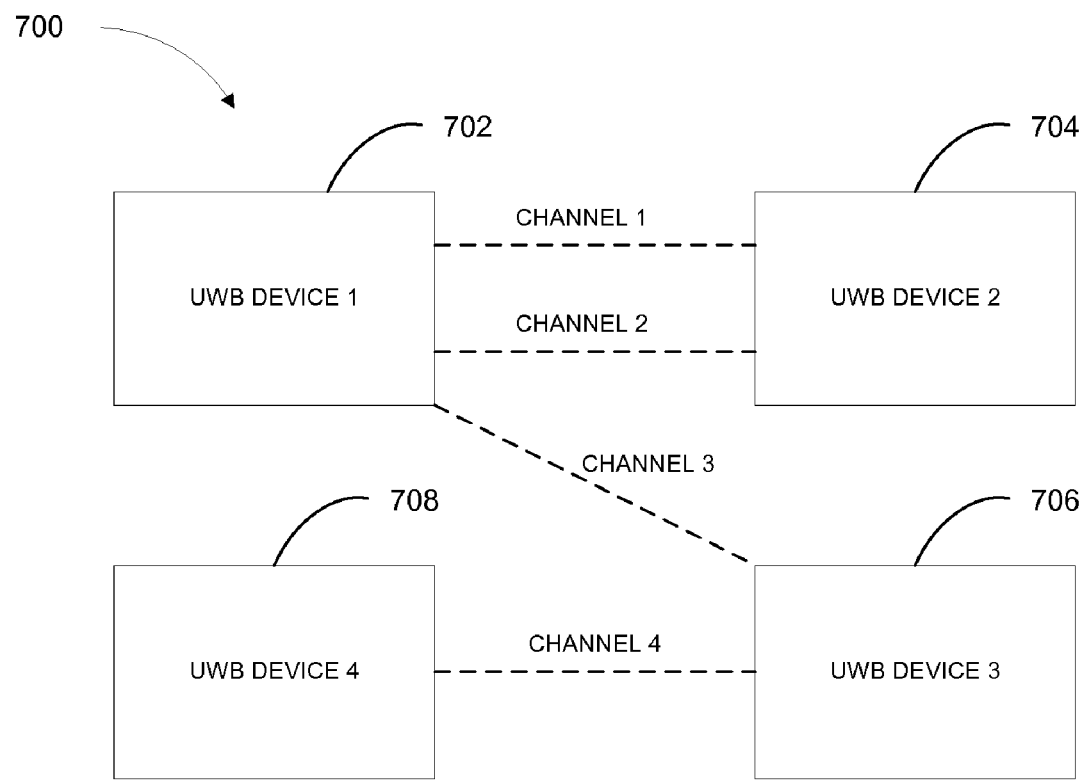
FIG. 7 illustrates a block diagram of various communications devices communicating with each other via various channels in accordance with another aspect of the disclosure.

FIG. 7 illustrates a block diagram of various ultra-wide band (UWB) communications devices communicating with each other via various channels in accordance with another aspect of the disclosure. For example, UWB device 1 702 is communicating with UWB device 2 704 via two concurrent UWB channels 1 and 2. UWB device 702 is communicating with UWB device 3 706 via a single channel 3. And, UWB device 3 706 is, in turn, communicating with UWB device 4 708 via a single channel 4. Other configurations are possible. The communications devices may be used for many different applications, and may be implemented, for example, in a headset, microphone, biometric sensor, heart rate monitor, pedometer, EKG device, watch, shoe, remote control, switch, tire pressure monitor, or other communications devices.

Any of the above aspects of the disclosure may be implemented in many different devices. For example, in addition to medical applications as discussed above, the aspects of the disclosure may be applied to health and fitness applications. Additionally, the aspects of the disclosure may be implemented in shoes for different types of applications. There are other multitude of applications that may incorporate any aspect of the disclosure as described herein.

Various aspects of the disclosure have been described above. It should be apparent that the teachings herein may be embodied in a wide variety of forms and that any specific structure, function, or both being disclosed herein is merely representative. Based on the teachings herein one skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein. As an example of some of the above concepts, in some aspects concurrent channels may be established based on pulse repetition frequencies. In some aspects concurrent channels may be established based on pulse position or offsets. In some aspects concurrent channels may be established based on time hopping sequences. In some aspects concurrent channels may be established based on pulse repetition frequencies, pulse positions or offsets, and time hopping sequences.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, processors, means, circuits, and algorithm steps described in connection with the aspects disclosed herein may be implemented as electronic hardware (e.g., a digital implementation, an analog implementation, or a combination of the two, which may be designed using source coding or some other technique), various forms of program or design code incorporating instructions (which may be referred to herein, for convenience, as "software" or a "software module"), or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented within or performed by an integrated circuit ("IC"), an access terminal, or an access point. The IC may comprise a general purpose processor, a digital signal processor (DSP), an application specific integrated circuit (ASIC), a field programmable gate array (FPGA) or other programmable logic device, discrete gate or transistor logic, discrete hardware components, electrical components, optical components, mechanical components, or any combination thereof designed to perform the functions described herein, and may execute codes or instructions that reside within the IC, outside of the IC, or both. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

It is understood that any specific order or hierarchy of steps in any disclosed process is an example of a sample approach. Based upon design preferences, it is understood that the specific order or hierarchy of steps in the processes may be rearranged while remaining within the scope of the present disclosure. The accompanying method claims present elements of the various steps in a sample order, and are not meant to be limited to the specific order or hierarchy presented.

The steps of a method or algorithm described in connection with the aspects disclosed herein may be embodied directly in hardware, in a software module executed by a processor, or in a combination of the two. A software module (e.g., including executable instructions and related data) and other data may reside in a data memory such as RAM memory, flash memory, ROM memory, EPROM memory, EEPROM memory, registers, a hard disk, a removable disk, a CD-ROM, or any other form of computer-readable storage medium known in the art. A sample storage medium may be coupled to a machine such as, for example, a computer/processor (which may be referred to herein, for convenience, as a "processor") such the processor can read information (e.g., code) from and write information to the storage medium. A sample storage medium may be integral to the processor. The processor and the storage medium may reside in an ASIC. The ASIC may reside in user equipment. In the alternative, the processor and the storage medium may reside as discrete components in user equipment. Moreover, in some aspects any suitable computer-program product may comprise a computer-readable medium comprising codes relating to one or more of the aspects of the disclosure. In some aspects a computer program product may comprise packaging materials.

While the invention has been described in connection with various aspects, it will be understood that the invention is capable of further modifications. This application is intended to cover any variations, uses or adaptation of the invention following, in general, the principles of the invention, and including such departures from the present disclosure as come within the known and customary practice within the art to which the invention pertains.

What is claimed is:

1. An apparatus for wireless communications comprising:
   a signal generator adapted to generate a substantially periodic signal including a plurality of cycles; and
   a modulator adapted to modulate an amplitude, a phase or both the amplitude and the phase of the periodic signal on a per cycle basis with a defined modulation signal to achieve a defined frequency spectrum for the modulated periodic signal, wherein the defined frequency spectrum defines an ultra-wide band channel having a fractional bandwidth on the order of 20% or more, a bandwidth on the order of 500 MHz or more, or a fractional bandwidth on the order of 20% or more and a bandwidth on the order of 500 MHz or more.

2. The apparatus of claim 1, wherein the defined modulation signal comprises a substantially root raised cosine signal.

3. The apparatus of claim 1, wherein the signal generator comprises a voltage controlled oscillator (VCO) adapted to generate the periodic signal.

4. The apparatus of claim 1, wherein the signal generator further comprises a calibration device adapted to calibrate the frequency of the periodic signal.

5. The apparatus of claim 1, further comprising a timing module adapted to provide a timing signal to the modulator to control the modulation of the amplitude, the phase, or both the amplitude and the phase of the periodic signal on the per cycle basis.

6. The apparatus of claim 5, wherein the timing module is adapted to receive a timing source signal from the signal generator.

7. The apparatus of claim 6, wherein the timing module further comprises sequential logic adapted to generate the timing signal in response to the timing source signal.

8. The apparatus of claim 1, further comprising a timing module adapted to provide a timing signal to the signal generator to control the phase modulation of the periodic signal on the per cycle basis.

9. The apparatus of claim 1, wherein the modulator comprises:
   a plurality of capacitors;
   a circuit adapted to charge the capacitors; and
   a switch network adapted to selectively couple one or more of the charged capacitors to an amplifier amplifying the periodic signal.

10. The apparatus of claim 9, wherein the amplifier comprises a power amplifier.

11. A method for wireless communications comprising:
    generating a substantially periodic signal including a plurality of cycles; and
    modulating an amplitude, a phase or both the amplitude and the phase of the periodic signal on a per cycle basis with a defined modulation signal to achieve a defined frequency spectrum for the modulated periodic signal, wherein the defined frequency spectrum defines an ultra-wide band channel having a fractional bandwidth on the order of 20% or more, a bandwidth on the order of 500 MHz or more, or a fractional bandwidth on the order of 20% or more and a bandwidth on the order of 500 MHz or more.

12. The method of claim 11, wherein the defined modulation signal comprises a substantially raised cosine signal.

13. The method of claim 11, wherein generating the periodic signal comprises controlling a voltage controlled oscillator (VCO) to generate the periodic signal.

14. The method of claim 11, further comprising calibrating the frequency of the periodic signal.

15. The method of claim 11, further comprising generating a timing signal to control the modulation of the amplitude, the phase, or both the amplitude and the phase of the periodic signal on the per cycle basis.

16. The method of claim 15, wherein generating the timing signal is based on the periodic signal.

17. The method of claim 15, wherein generating the timing signal comprises using sequential logic responsive to the periodic signal to control the modulation of the periodic signal on the per cycle basis.

18. The method of claim 11, further comprising generating a timing signal to control the generating of the periodic signal so as to phase modulate the periodic signal on the per cycle basis.

19. The method of claim 11, wherein modulating the amplitude of the periodic signal comprises:
    charging a plurality of capacitors; and
    selectively coupling one or more of the charged capacitors to an amplifier amplifying the periodic signal.

20. The method of claim 19, wherein amplifying the periodic signal comprises using a power amplifier to amplify the periodic signal.

21. An apparatus for wireless communications comprising:
    means for generating a substantially periodic signal including a plurality of cycles; and
    means for modulating an amplitude, a phase or both the amplitude and the phase of the periodic signal on a per cycle basis with a defined modulation signal to achieve a defined frequency spectrum for the modulated periodic signal, wherein the defined frequency spectrum defines an ultra-wide band channel having a fractional bandwidth on the order of 20% or more, a bandwidth on the order of 500 MHz or more, or a fractional bandwidth on the order of 20% or more and a bandwidth on the order of 500 MHz or more.

22. A computer program product for wireless communications comprising:
    a computer readable medium including codes executable by at least one processor to:
    generate a substantially periodic signal including a plurality of cycles; and
    modulate an amplitude, a phase or both the amplitude and the phase of the periodic signal on a per cycle basis with a defined modulation signal to achieve a defined frequency spectrum for the modulated periodic signal, wherein the defined frequency spectrum defines an ultra-wide band channel having a fractional bandwidth on the order of 20% or more, a bandwidth on the order of 500 MHz or more, or a fractional bandwidth on the order of 20% or more and a bandwidth on the order of 500 MHz or more.

23. A headset, comprising:
    a transducer adapted to generate audio data; and
    a transmitter adapted to transmit the audio data, wherein the transmitter comprises:

a signal generator adapted to generate a substantially periodic signal including a plurality of cycles; and a modulator adapted to modulate an amplitude, a phase or both the amplitude and the phase of the periodic signal on a per cycle basis with a defined modulation signal to achieve a defined frequency spectrum for the modulated periodic signal, wherein the defined frequency spectrum defines an ultra-wide band channel having a fractional bandwidth on the order of 20% or more, a bandwidth on the order of 500 MHz or more, or a fractional bandwidth on the order of 20% or more and a bandwidth on the order of 500 MHz or more.

24. A watch, comprising:

a transmitter adapted to transmit data via a wireless communication channel, wherein the transmitter comprises:

a signal generator adapted to generate a substantially periodic signal including a plurality of cycles;

a modulator adapted to modulate an amplitude, a phase or both the amplitude and the phase of the periodic signal on a per cycle basis with a defined modulation signal to achieve a defined frequency spectrum for the modulated periodic signal, wherein the defined frequency spectrum defines an ultra-wide band channel having a fractional bandwidth on the order of 20% or more, a bandwidth on the order of 500 MHz or more, or a fractional bandwidth on the order of 20% or more and a bandwidth on the order of 500 MHz or more; and a user interface adapted to provide an indication based on data received via the wireless communication channel.

25. A sensing device for wireless communications, comprising:

a sensor adapted to generate sensed data; and a transmitter adapted to transmit the sensed data, wherein the transmitter comprises:

a signal generator adapted to generate a substantially periodic signal including a plurality of cycles; and a modulator adapted to modulate an amplitude, a phase or both the amplitude and the phase of the periodic signal on a per cycle basis with a defined modulation signal to achieve a defined frequency spectrum for the modulated periodic signal, wherein the defined frequency spectrum defines an ultra-wide band channel having a fractional bandwidth on the order of 20% or more, a bandwidth on the order of 500 MHz or more, or a fractional bandwidth on the order of 20% or more and a bandwidth on the order of 500 MHz or more.

26. An apparatus for wireless communications comprising:

a signal generator adapted to generate a substantially periodic signal including a plurality of cycles;

a modulator adapted to modulate an amplitude, a phase or both the amplitude and the phase of the periodic signal on a per cycle basis; and a timing module adapted to provide a timing signal to the modulator to control the modulation of the amplitude, the phase, or both the amplitude and the phase of the periodic signal on the per cycle basis, wherein the timing module is adapted to receive a timing source signal from the signal generator, and further wherein the timing module further comprises sequential logic adapted to generate the timing signal in response to the timing source signal.

27. The apparatus of claim 26, wherein the modulator is adapted to modulate the amplitude, the phase, or both the amplitude and phase of the periodic signal with a defined modulation signal.

28. The apparatus of claim 27, wherein the defined modulation signal comprises a substantially root raised cosine signal.

29. The apparatus of claim 27, wherein the defined modulation signal is configured to achieve a defined frequency spectrum for the modulated periodic signal.

30. The apparatus of claim 29, wherein the defined frequency spectrum for the modulated periodic signal defines an ultra-wide band channel having a fractional bandwidth on the order of 20% or more, a bandwidth on the order of 500 MHz or more, or a fractional bandwidth on the order of 20% or more and a bandwidth on the order of 500 MHz or more.

31. The apparatus of claim 26, wherein the signal generator comprises a voltage controlled oscillator (VCO) adapted to generate the periodic signal.

32. The apparatus of claim 26, wherein the signal generator further comprises a calibration device adapted to calibrate the frequency of the periodic signal.

33. The apparatus of claim 26, wherein the modulator comprises:

a plurality of capacitors;

a circuit adapted to charge the capacitors; and a switch network adapted to selectively couple one or more of the charged capacitors to an amplifier amplifying the periodic signal.

34. The apparatus of claim 33, wherein the amplifier comprises a power amplifier.

35. A method for wireless communications comprising:

generating a substantially periodic signal including a plurality of cycles;

modulating an amplitude, a phase or both the amplitude and the phase of the periodic signal on a per cycle basis; and generating a timing signal to control the modulation of the amplitude, the phase, or both the amplitude and the phase of the periodic signal on the per cycle basis, wherein generating the timing signal is based on the periodic signal, and further wherein generating the timing signal comprises using sequential logic responsive to the periodic signal to control the modulation of the periodic signal on the per cycle basis.

36. The method of claim 35, wherein modulating the amplitude, the phase, or both the amplitude and the phase of the periodic signal comprises modulating the periodic signal with a defined modulation signal.

37. The method of claim 36, wherein the defined modulation signal comprises a substantially raised cosine signal.

38. The method of claim 36, wherein the defined modulation signal is configured to achieve a defined frequency spectrum for the modulated periodic signal.

39. The method of claim 38, wherein the defined frequency spectrum for the modulated periodic signal defines an ultra-wide band channel that has a fractional bandwidth on the order of 20% or more, a bandwidth on the order of 500 MHz or more, or a fractional bandwidth on the order of 20% or more and a bandwidth on the order of 500 MHz or more.

40. The method of claim 35, wherein generating the periodic signal comprises controlling a voltage controlled oscillator (VCO) to generate the periodic signal.

41. The method of claim 35, further comprising calibrating the frequency of the periodic signal.

42. The method of claim 35, wherein modulating the amplitude of the periodic signal comprises:

charging a plurality of capacitors; and selectively coupling one or more of the charged capacitors to an amplifier amplifying the periodic signal.

43. The method of claim 42, wherein amplifying the periodic signal comprises using a power amplifier to amplify the periodic signal.

44. An apparatus for wireless communications comprising:
means for generating a substantially periodic signal including a plurality of cycles;
means for modulating an amplitude, a phase or both the amplitude and the phase of the periodic signal on a per cycle basis; and
means for generating a timing signal to control the modulation of the amplitude, the phase, or both the amplitude and the phase of the periodic signal on the per cycle basis, wherein the timing signal generating means is adapted to receive a timing source signal from the signal generating means, and further wherein the timing signal generating means comprises sequential logic adapted to generate the timing signal in response to the timing source signal.

45. A computer program product for wireless communications comprising:
a computer readable medium including codes executable by at least one processor to:
generate a substantially periodic signal including a plurality of cycles;
modulate an amplitude, a phase or both the amplitude and the phase of the periodic signal on a per cycle basis; and
generate a timing signal to control the modulation of the amplitude, the phase, or both the amplitude and the phase of the periodic signal on the per cycle basis, wherein generating the timing signal is based on the periodic signal, and further wherein generating the timing signal comprises using sequential logic responsive to the periodic signal to control the modulation of the periodic signal on the per cycle basis.

46. A headset, comprising:
a transducer adapted to generate audio data; and
a transmitter adapted to transmit the audio data, wherein the transmitter comprises:
a signal generator adapted to generate a substantially periodic signal including a plurality of cycles;
a modulator adapted to modulate an amplitude, a phase or both the amplitude and the phase of the periodic signal on a per cycle basis; and
a timing module adapted to provide a timing signal to the modulator to control the modulation of the amplitude, the phase, or both the amplitude and the phase of the periodic signal on the per cycle basis, wherein the timing module is adapted to receive a timing source signal from the signal generator, and further wherein the timing module further comprises sequential logic adapted to generate the timing signal in response to the timing source signal.

47. A sensing device for wireless communications, comprising:
a sensor adapted to generate sensed data; and
a transmitter adapted to transmit the sensed data, wherein the transmitter comprises:
a signal generator adapted to generate a substantially periodic signal including a plurality of cycles;
a modulator adapted to modulate an amplitude, a phase or both the amplitude and the phase of the periodic signal on a per cycle basis; and
a timing module adapted to provide a timing signal to the modulator to control the modulation of the amplitude, the phase, or both the amplitude and the phase of the periodic signal on the per cycle basis, wherein the timing module is adapted to receive a timing source signal from the signal generator, and further wherein the timing module further comprises sequential logic adapted to generate the timing signal in response to the timing source signal.

48. An apparatus for wireless communications comprising:
a signal generator adapted to generate a substantially periodic signal including a plurality of cycles; and
a modulator adapted to modulate an amplitude, or both the amplitude and a phase of the periodic signal on a per cycle basis, wherein the modulator comprises:
a plurality of capacitors;
a circuit adapted to charge the capacitors; and
a switch network adapted to selectively couple one or more of the charged capacitors to an amplifier amplifying the periodic signal.

49. The apparatus of claim 48, wherein the modulator is adapted to modulate the amplitude, or both the amplitude and the phase of the periodic signal with a defined modulation signal.

50. The apparatus of claim 49, wherein the defined modulation signal comprises a substantially root raised cosine signal.

51. The apparatus of claim 49, wherein the defined modulation signal is configured to achieve a defined frequency spectrum for the modulated periodic signal.

52. The apparatus of claim 51, wherein the defined frequency spectrum for the modulated periodic signal defines an ultra-wide band channel having a fractional bandwidth on the order of 20% or more, a bandwidth on the order of 500 MHz or more, or a fractional bandwidth on the order of 20% or more and a bandwidth on the order of 500 MHz or more.

53. The apparatus of claim 48, wherein the signal generator comprises a voltage controlled oscillator (VCO) adapted to generate the periodic signal.

54. The apparatus of claim 48, wherein the signal generator further comprises a calibration device adapted to calibrate the frequency of the periodic signal.

55. The apparatus of claim 48, further comprising a timing module adapted to provide a timing signal to the modulator to control the modulation of the amplitude, the phase, or both the amplitude and the phase of the periodic signal on the per cycle basis.

56. The apparatus of claim 55, wherein the timing module is adapted to receive a timing source signal from the signal generator.

57. The apparatus of claim 56, wherein the timing module further comprises sequential logic adapted to generate the timing signal in response to the timing source signal.

58. The apparatus of claim 48, further comprising a timing module adapted to provide a timing signal to the signal generator to control the phase modulation of the periodic signal on the per cycle basis.

59. The apparatus of claim 48, wherein the amplifier comprises a power amplifier.

60. A method for wireless communications comprising:
generating a substantially periodic signal including a plurality of cycles; and
modulating an amplitude, or both the amplitude and a phase of the periodic signal on a per cycle basis, wherein modulating the amplitude of the periodic signal comprises:
charging a plurality of capacitors; and
selectively coupling one or more of the charged capacitors to an amplifier amplifying the periodic signal.

61. The method of claim 60, wherein modulating the amplitude, or both the amplitude and the phase of the periodic signal comprises modulating the periodic signal with a defined modulation signal.

62. The method of claim 61, wherein the defined modulation signal comprises a substantially raised cosine signal.

63. The method of claim 61, wherein the defined modulation signal is configured to achieve a defined frequency spectrum for the modulated periodic signal.

64. The method of claim 63, wherein the defined frequency spectrum for the modulated periodic signal defines an ultra-wide band channel that has a fractional bandwidth on the order of 20% or more, a bandwidth on the order of 500 MHz or more, or a fractional bandwidth on the order of 20% or more and a bandwidth on the order of 500 MHz or more.

65. The method of claim 60, wherein generating the periodic signal comprises controlling a voltage controlled oscillator (VCO) to generate the periodic signal.

66. The method of claim 60, further comprising calibrating the frequency of the periodic signal.

67. The method of claim 60, further comprising generating a timing signal to control the modulation of the amplitude, the phase, or both the amplitude and the phase of the periodic signal on the per cycle basis.

68. The method of claim 67, wherein generating the timing signal is based on the periodic signal.

69. The method of claim 67, wherein generating the timing signal comprises using sequential logic responsive to the periodic signal to control the modulation of the periodic signal on the per cycle basis.

70. The method of claim 60, further comprising generating a timing signal to control the generating of the periodic signal so as to phase modulate the periodic signal on the per cycle basis.

71. The method of claim 60, wherein amplifying the periodic signal comprises using a power amplifier to amplify the periodic signal.

72. An apparatus for wireless communications comprising:
 means for generating a substantially periodic signal including a plurality of cycles; and
 means for modulating an amplitude, or both the amplitude and a phase of the periodic signal on a per cycle basis, wherein the modulating means comprises:
 means for storing charges;
 means for charging the charge storing means; and
 means for selectively couple the charge storing means to a means for amplifying the periodic signal.

73. A computer program product for wireless communications comprising:
 a computer readable medium including codes executable by at least one processor to:
 generate a substantially periodic signal including a plurality of cycles; and
 modulate an amplitude, or both the amplitude and a phase of the periodic signal on a per cycle basis including:
 charging a plurality of capacitors; and
 selectively coupling one or more of the charged capacitors to an amplifier amplifying the periodic signal.

74. A headset, comprising:
 a transducer adapted to generate audio data; and
 a transmitter adapted to transmit the audio data, wherein the transmitter comprises:
 a signal generator adapted to generate a substantially periodic signal including a plurality of cycles;
 a modulator adapted to modulate an amplitude, or both the amplitude and a phase of the periodic signal on a per cycle basis, wherein the modulator comprises:
 a plurality of capacitors;
 a circuit adapted to charge the capacitors; and
 a switch network adapted to selectively couple one or more of the charged capacitors to an amplifier amplifying the periodic signal.

75. A sensing device for wireless communications, comprising:
 a sensor adapted to generate sensed data; and
 a transmitter adapted to transmit the sensed data, wherein the transmitter comprises:
 a signal generator adapted to generate a substantially periodic signal including a plurality of cycles; and
 a modulator adapted to modulate an amplitude, or both the amplitude and a phase of the periodic signal on a per cycle basis, wherein the modulator comprises:
 a plurality of capacitors;
 a circuit adapted to charge the capacitors; and
 a switch network adapted to selectively couple one or more of the charged capacitors to an amplifier amplifying the periodic signal.

* * * * *